(12) United States Patent
Ruck

(10) Patent No.: US 7,583,147 B2
(45) Date of Patent: Sep. 1, 2009

(54) BUFFER DRIVE

(75) Inventor: Bernhard Ruck, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/111,307

(22) Filed: Apr. 29, 2008

(65) Prior Publication Data

US 2008/0278233 A1 Nov. 13, 2008

Related U.S. Application Data

(60) Provisional application No. 61/016,678, filed on Dec. 26, 2007.

(30) Foreign Application Priority Data

May 7, 2007 (DE) .................... 10 2007 021 254

(51) Int. Cl.
*H03F 3/45* (2006.01)
(52) U.S. Cl. .................... 330/261; 330/257
(58) Field of Classification Search .............. 330/261, 330/257, 253, 69
See application file for complete search history.

(56) References Cited

U.S. PATENT DOCUMENTS

| | | | |
|---|---|---|---|
| 5,311,145 A * | 5/1994 | Huijsing et al. ............ 330/255 |
| 5,485,119 A | 1/1996 | Kimura | |
| 5,712,594 A | 1/1998 | Kimura | |
| 5,909,136 A | 6/1999 | Kimura | |
| 6,218,902 B1 | 4/2001 | Kung | |
| 7,310,017 B2 * | 12/2007 | Etou ........................ 330/253 |
| 7,330,074 B2 * | 2/2008 | Kang et al. ................. 330/255 |
| 7,411,452 B2 * | 8/2008 | Lu et al. .................... 330/253 |
| 7,522,003 B2 * | 4/2009 | Seth et al. .................. 330/296 |
| 2004/0212425 A1 | 10/2004 | Parkhurst | |
| 2005/0128000 A1 | 6/2005 | Parkhurst | |
| 2005/0275459 A1 | 12/2005 | Nishimura | |
| 2006/0226877 A1 | 10/2006 | Nishimura et al. | |
| 2007/0194851 A1 | 8/2007 | Carreto et al. | |

FOREIGN PATENT DOCUMENTS

EP 0608886 A2 1/1994

* cited by examiner

*Primary Examiner*—Henry K Choe
(74) *Attorney, Agent, or Firm*—Mirna G. Abyad; Wade J. Brady, III; Frederick J. Telecky, Jr.

(57) ABSTRACT

The present invention relates to a CMOS buffer circuit for liquid crystal display (LCD) drivers, which includes a single stage operational transconductance amplifier (OTA) with a differential of transistors for receiving a differential input voltage, a bias current source coupled to the differential pair and a single-ended output, the first bias current generating stage with a differential pair of transistors coupled to receive the differential input voltage to produce an output current in an output current path in response to a positive differential input voltage, a second bias current generating stage with a differential pair of transistors coupled to receive the inverted differential input voltage to produce an output current in an output current path in response to a negative input voltage, wherein the output current paths of both bias current generating stages are combined in a common current path and the current in the common current path is mirrored to the bias current source of the single stage OTA, so as to increase the bias current through the bias current source in response to an increasing magnitude of the differential input voltage.

5 Claims, 1 Drawing Sheet

BUFFER DRIVE

CROSS-REFERENCE TO RELATED APPLICATIONS

The present invention claims benefit of German patent application filing number 10 2007 021 254.4, filed on May 7, 2007, which is herein incorporated by reference, and U.S. Provisional Application Ser. No. 61/016,678, filed on Dec. 26, 2007, which is also herein incorporated by reference.

BACKGROUND OF THE INVENTION

1. Field of the Invention

The present invention relates to a CMOS buffer circuit for liquid crystal display (LCD) drivers; more particularly, the present invention relates to an improved architecture for CMOS buffer that is utilized for abruptly varying capacitive loads.

2. Description of the Related Art

Liquid crystal displays (LCDs) in portable electronic equipment are usually controlled by a switch matrix coupling segments of the LCD to buffer drivers. The buffers are used to drive the LCD segments with a stable voltage. However, changing the number and location of the LCD segments connected to the buffers by the switch matrix abruptly changes the capacitive load on the buffers. In order to allow the required large currents to be drawn from the driver circuits, the buffers are dimensioned to satisfy the maximum currents. This results in increased overall power consumption.

Some current solutions suggest using a one stage CMOS operational amplifier as a buffer, where an additional output current is added to the output branches of the CMOS operational amplifier. However, in such solutions, adaptively biased operational amplifier is not able to provide the same amount of extra output current quickly enough, as the speed of the amplifier remains unchanged. Other solutions with better speed use several gain stages and have restricted stability, especially for larger capacitive loads.

Accordingly, there is a need in the art for an improved architecture for a buffer to be used for abruptly varying capacitive loads, which may be faster and may reduced power consumption.

SUMMARY OF THE INVENTION

Embodiments of the present invention generally relate to a CMOS buffer circuit for liquid crystal display (LCD) drivers is provided, including a single stage operational transconductance amplifier (OTA) with a differential pair of transistors for receiving a differential input voltage, a bias current source coupled to the differential pair and a single-ended output, a first bias current generation stage with a differential pair of transistors coupled to receive the differential input voltage to produce an output current in an output current path in response to a positive differential input voltage, a second bias current generating stage with a differential pair of transistors coupled to receive the inverted differential input voltage to produce an output current in an output current path in response to a negative input voltage, wherein the output current path of both bias current generating stages are combined in a common current path and a current in the common current path is mirrored to the bias current source of the single stage OTA, so as to increase the bias current through the bias current source in response to an increasing magnitude of the differential input voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Further advantages and characteristics of the invention ensue from the description below of a preferred embodiment, and from the accompanying drawings, in which.

DETAILED DESCRIPTION

Figure 1:
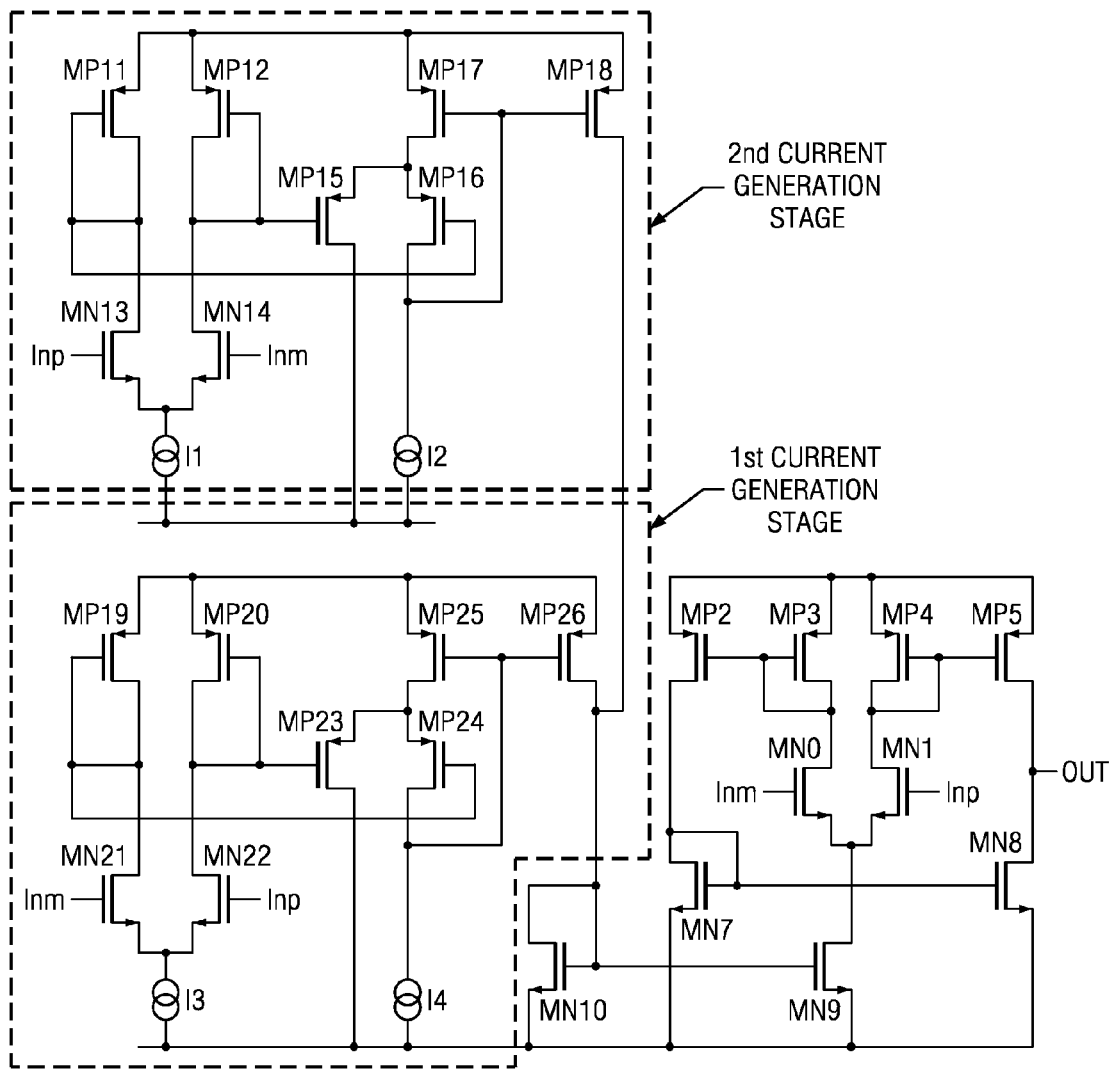
FIG. 1 is a buffer driver according to the present invention.

In FIG. 1, a CMOS buffer circuit for liquid crystal display (LCD) drivers is provided, including a single stage operational transconductance amplifier (OTA) with a differential pair of transistors for receiving a differential input voltage, a bias current source coupled to the differential pair and a single-ended output, a first bias current generation stage with a differential pair of transistors coupled to receive the differential input voltage to produce an output current in an output current path in response to a positive differential input voltage, a second bias current generating stage with a differential pair of transistors coupled to receive the inverted differential input voltage to produce an output current in an output current path in response to a negative input voltage, wherein the output current path of both bias current generating stages are combined in a common current path and a current in the common current path is mirrored to the bias current source of the single stage OTA, so as to increase the bias current through the bias current source in response to an increasing magnitude of the differential input voltage.

According to the present invention, a single stage operational transconductance amplifier is provided, which is inherently stable, in particular if large capacitive loads are coupled to the output of the amplifier. The first and the second bias current generating stages are coupled to provide an increased bias current to the differential pair of the OTA in response to either a positive or a negative voltage difference at the differential voltage input of the OTA.

The differential input voltage is also coupled to the inputs of the first and the second bias current generating stages. One bias current generating stage receives the differential input voltage with opposite polarity. This configuration takes account of the requirement to react on differential voltages in positive and in negative direction. An increased bias current in the differential pair of the single stage OTA has a two-fold effect. Firstly, as the current in the input stage increases, the transconductance gm of the input stage increases and the overall speed of the OTA is higher. Secondly, as the bias current from the input stage is mirrored to the output branches, the output current for charging and discharging the capacitive loads is also increased.

According to an aspect of the present invention, the second bias current generating stages are substantially similar to each other. The only difference between the two stages is the coupling of the input voltage having the opposite polarity for one of the bias current generating stages. This allows an increased current for voltage differences of the input voltage to be provided independent of the polarity of the input voltage. Using the same basic architecture for the bias current generating stages simplifies the design and layout procedure.

Preferably, the current through the bias current source of the OTA increases exponentially in response to an increasing magnitude of the differential voltage input to the current mirror from the two bias circuits. This allows the OTA to respond quickly to a change at the input voltage. The specific implementation of a bias current generating stage may be carried out as follows. Accordingly, each bias current generating stage has two diode coupled load transistors coupled to the transistors of the differential pair and a constant current source coupled to the common source connection of the differential pair. The CMOS buffer includes further a first and a second transistor, the gates of which are coupled to the gates of the respective load transistors of the differential pair and the common source connection of the first and the second transistors are coupled to the drain of a third transistor. The drain of the first transistor is coupled to ground and a drain of the second transistor is coupled to a constant current source, wherein the source of the third transistor is connected to a supply voltage and the gate of the third transistor is coupled to the drain of the second transistor.

Eventually, a fourth transistor is coupled by its gate to the third transistor to mirror current through the third transistor to the fourth transistor. Dependent on the magnitude and the polarity of the input voltage coupled to the differential input pair of the current generating stage, the gate source voltage of the third transistor increases or decreases, such that the current through the fourth transistor is increased and decreased in accordance with the current through the third transistor. In particular, the current increases exponentially in response to an increase of the voltage difference of the input differential voltage.

If the output of the OTA is connected to a negative input of the differential pair of the OTA, the OTA operates as a voltage follower having an amplification factor of 1. If the capacitive load coupled to the output of the voltage follower changes abruptly, the voltage difference at the inputs of the OTA increases. Accordingly, the bias current generating stages, either the first or the second dependent on the polarity of the input voltage, provides an increased current to the bias current source of the single stage OTA. Consequently, the OTA is biased to react immediately on the change of the output capacitance. When the output buffer according to the present invention has compensated the change of capacitance, the voltage difference at the inputs of the OTA returns to substantially zero and the bias current through the bias current source of the OTA returns to its minimum value. The power consumption of the buffer according to the present invention is minimized as only the amount of current is supplied to the differential pair of the OTA, which is required to allow the change of capacitance to be compensated for quickly. Accordingly, the upper circuits according to the present invention have a low quiescent current, they are stable with any capacitive load and they are able to drive varying capacitive loads quickly.

FIG. 1 shows the buffer driver with a current mirror, which includes two complementary pairs of transistors. An n-channel MOS transistor MN1 and a pchannel MOS transistor MP4 have interconnected drain terminals and form the first complementary pair of MOS transistors and an n-channel MOS transistor MN0 and a p-channel MOS transistor MP3 also have interconnected drain terminals and from the second complementary pair of transistors. The gate terminal of the transistor MN1 is operable to receive an input signal Inp and the gate terminal of the transistor MN0 is operable to receive an input signal Inm. The source terminals of the transistors MN0 and MN1 are interconnected, as are the source terminals of the transistors MP3 and MP4. The gate and drain terminals of the transistor MP3 are interconnected and the gate and drain terminals of the transistor MP4 are interconnected. A node interconnecting the source terminals of the transistors MN0 and MN1 is connected to the drain terminal of an n-channel MOS transistor MN9. The source terminal of the transistor MN9 is connected to ground.

Source terminals of the transistors MP3 and MP4 are also connected to the source terminals of p-channel MOS transistors MP2 and MP5, respectively. The transistors MP2 and MP3 also have interconnected gate terminals, as do the transistors MP4 and MP5. The drain terminal of the transistor MP2 is connected to the drain terminal of an n-channel MOS transistor MN7 and the drain terminal of the transistor MP5 is connected to the drain terminal of an n-channel MOS transistor MN8. Gate terminals of the transistors MN7 and MN8 are interconnected. The gate and drain terminals of the transistor MN7 are interconnected. Source terminals of the transistors MN7 and MN8 are connected to ground so that the source terminals of the transistors MN7, MN8 and MN9 are interconnected.

The transistors, MN0, MN1, MP2, MP3, MP4, MP5, MN7 and MN8 then form a CMOS current mirror, which is a buffer driver circuit. The output from the current mirror is provided at a node interconnecting the drain terminals of the transistors MP5 and MN8. The gate terminal of the transistor MN9 is connected to the gate terminal of another n-channel MOS transistor MN10. The source terminal of the transistor MN10 is connected to ground. The gate terminal and the drain terminal of the transistor MN10 are interconnected so that both the gate terminal and the drain terminal of the transistor MN10 are connected to two circuits, both of which are operable to provide a bias current to the current mirror.

The first circuit for generating a bias current comprises two complementary pairs of MOS transistors. Two p-channel MOS transistors MP11 and MP12 have interconnected source terminals. The transistor MP11 has a drain terminal connected to the drain terminal of an n-channel MOS transistor MN13 and the transistor MP12 has a drain terminal connected to the drain of an n-channel MOS transistor MN14. The source terminals of the transistors MP11 and MP12 are interconnected and the source terminals of the transistors MN13 and MN14 are interconnected. A node interconnecting the source terminals of the transistors MN13 and MN14 is connected to a current source I1.

The gate terminal of the transistor MN13 is connected to the input Inp and the gate terminal of the transistor MN14 is connected to the input Inm. The gate and drain terminals of the transistor MP11 are interconnected and the gate and drain terminals of the transistor MP12 are also interconnected. The gate and drain terminals of the transistor MP12 are also connected to the gate terminal of a pchannel MOS transistor MP15 and the gate and drain terminals of the transistor MP11 are connected to the gate terminal of a p-channel MOS transistor MP16.

The source terminals of the transistors MP15 and MP16 and are also connected to the drain terminal of another p-channel MOS transistor MP17. The source terminal of the transistor MP17 is connected to the source terminals of the transistors MP11 and MP12, and to the source terminal of another p-channel MOS transistor MP18. The gate terminals of the transistors MP17 and MP18 are interconnected and a node interconnecting the gate terminals of the transistors MP17 and MP18 is connected to the drain terminal of the transistor MP16. The drain terminal of the transistor MP16 and the gate terminals of the transistors MP17 and MP18 are then connected to a second current source I2. The current sources I1 and I2 are also connected to ground, as is the drain terminal of the transistor MP15. The drain terminal of the transistor MP18 is connected to the drain terminal of the transistor MN10, as well as a node interconnecting the gate terminals of the transistors MN9 and MN10.

The second circuit for generating a bias current operable to be input to the current mirror comprises two complementary pairs of MOS transistors. The first pair consists of a p-channel MOS transistor MP19 having a drain terminal interconnected with the drain terminal of an n-channel MOS transistor MN21 and the second pair consists of a p-channel MOS transistor MP20 having a drain terminal interconnected with the drain terminal of an n-channel MOS transistor MN22. The source terminals of the transistors MP19 and MP20 and the source terminals of the transistors MN21 and MN22, respectively, are interconnected.

The gate terminal of the transistor MN21 is operable to receive the input signal Inm nad the gate terminal of the transistor MN22 is operable to receive the input signal Inp. The gate and drain terminals of the transistor MP19 are interconnected, as are the gate and drain terminals of the transistor MP20. A node interconnecting the gate and drain terminals of the transistor MP19 is connected to the gate terminal of a pchannel MOS transistor MP24 and a node interconnecting the gate and drain terminals of the transistor MP20 is connected to the gate terminal of a p-channel MOS transistor MP23. The source terminals of the transistors MP23 and MP24 are interconnected and are also connected to the drain terminal of another p-channel MOS transistor MP25. The source terminal of the transistor MP25 is connected to the source terminals of the transistors MP19 and MP20, and also to the source terminal of another p-channel MOS transistor MP26. The gate terminals of the transistors MP25 and MP26 are also interconnected and a node interconnecting the gate terminals of the transistors MP25 and MP26 is connected to the drain terminal of the transistor MP24.

A node interconnecting source terminals of the transistors MN21 and MN22 is connected to a current source I3 and a node interconnecting both gate terminals of the transistors MP25 and MP26 with the drain terminal of the transistor MP24 is connected to another current source I4. The other terminals of the current sources I3 and I4 are connected to ground, as is the drain terminal of the transistor MP23.

The drain terminal of the transistor MP26 is connected to the n-channel transistor MN10 at its drain terminal, and also to a node interconnecting the gate terminals of the transistors MN9 and MN10. Thus both current bias-generating circuits are connected to the current mirror circuit via the transistors MN9 and MN10. Therefore the two bias current-generating circuits are identical, apart from that the input signals Inp and Inm are input to corresponding opposing transistors.

In operation, an input signal Inp is input to the transistors MN13 and MN22 and an input signal Inm is input to the transistors MN14 and MN21. In the first bias current generating circuit; i.e., transistors MP11 to MP18, the difference between the voltages of the inputs Inp and Inm proportionally splits the current from the current source I1, routing a fraction of the current through each transistor MN13 and MN14. The same thing happens in the second bias current generating circuit comprising the transistors MN19 to MN26; the voltage difference between the inputs Inp and Inm proportionally splits the current from the current source I3 between the transistors MN21 and MN22.

If the voltage of the input signal Inp is lower than the signal Inm, then most of the current from the current source I1 will be routed through the transistor MN14, and most of the current from the current source I3 will be routed through the transistor MN21. For the first bias current generating circuit MP11 to MP18, more current flows through the transistors MP12 and MP15 than the transistors MP11 and MP16. The voltage drop across MP16 increases and the gate voltage of transistors MP17 and MP18 becomes more negative, i.e. moves closer to ground (GND). A low gate voltage opens transistors MP17 and MP18 and increases the current through MP18. The effect for the second bias current generating circuit MP19 to MP26 is different. More current flows through the transistors MP19 and MP24 than through the transistors MP20 and MP23. Yet, the current through transistor MP24 is limited to a constant current by current source I4. MP23 contributes only little or no current. So, the current through MP25 is basically defined by I4. This current is mirrored to MP26 and defines the minimum output current through MP26 if MP23 is closed. For a closed MP23, the second bias current generation circuit contributes only a minimum current through MN10.

If Inm is lower than Inp, the current through MP18 is approaches a lower limit, which is defined by current source I2 coupled to MP16, and MP17 in the same way as explained above. The exact proportions of the currents depend on the dimensions of the transistors. Generally, there is always a larger current through M10, either from the first or from the second bias generating circuit, which is mirrored to MN9.

If the difference between the inputs Inp and Inm is zero, only a very small bias current is provided. For properly dimensioned transistors, the output current of the bias current generating circuits is exponentially dependent on the difference in voltage between the input signals Inp and Inm. This exponential increase of the bias current allows a very fast charge up of capacitive loads. Furthermore, if the output voltage reaches the final value, the currents resume a minimum value, allowing a low average current consumption. Compared with multiple stage OTAs, the circuit according to the present invention is inherently stable.

Figure 2:
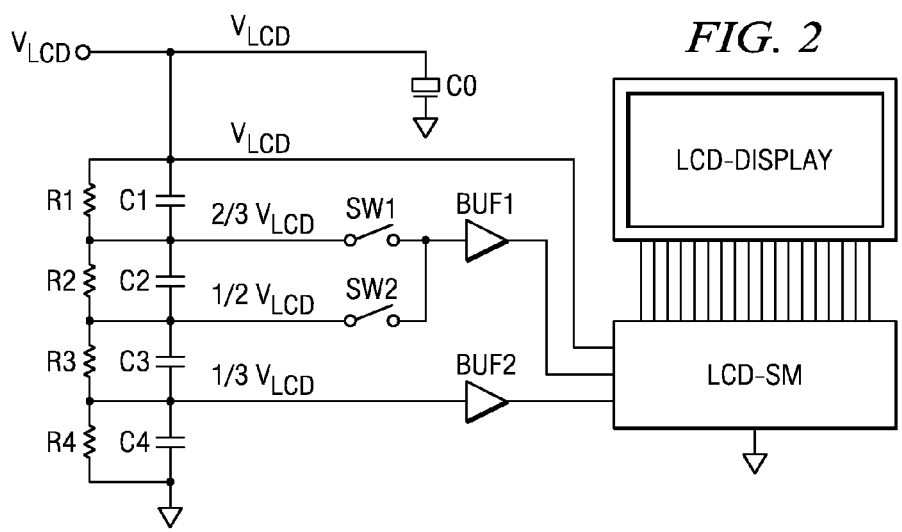
FIG. 2 is a simplified block diagram of an LCD driver using the buffer according to the present invention.

FIG. 2 shows a simplified block diagram and a schematic of an LCD driver configuration according to the present invention. A DC voltage $V_{LCD}$ is provided as a supply voltage for example by a charge pump or a similar means. The supply voltage $V_{LCD}$ is buffered by capacitor C0. The resistive voltage divider consisting of resistors R1, R2, R3 and R4 is used to provide fractions of the supply voltage $V_{LCD}$, such as $\frac{2}{3} V_{LCD}$, $\frac{1}{2} V_{LCD}$ or $\frac{1}{3} V_{LCD}$. The respective fractions of the supply voltage are buffered by capacitors C1, C2, C3 and C4. The buffer circuits according to the present invention are used as buffers BUF1 and BUF2.

The voltages $\frac{2}{3} V_{LCD}$, $\frac{1}{2} V_{LCD}$ and $\frac{1}{3} V_{LCD}$ are supplied to the LCD switch matrix LCD-SM used as an interconnection to the LCD display, which is preferably a multi-segment LCD display. Switches SW1 and SW2 serve to provide either $\frac{2}{3} V_{LCD}$ or $\frac{1}{2} V_{LCD}$ to BUF1. The magnitude of the fractions of the supply voltage $V_{LCD}$ depends on the specific LCD display and may be different for different applications. The switching of the switch matrix LCD-SM converts the DC input voltage $V_{LCD}$ (and likewise the fractions $\frac{2}{3} V_{LCD}$, $\frac{1}{2} V_{LCD}$ and $\frac{1}{3} V_{LCD}$) into an alternating voltage for the LCD display LCD-DISP. If the switch matrix LCD-SM connects the buffers BUF1 and BUF2 to different segments of the LCD display LCD-DISP, as sudden change of the capacitive load occurs at the outputs of BUF1 or/and BUF2. Accordingly, the output current is to be increased immediately.

If the OTA according to the present invention is coupled as a voltage follower, a sudden change of the output capacitance entails a change of the input differential voltage for each OTA. A difference voltage at the inputs of the OTA and the respective bias current generating stages as explained above, results in an increased bias current through the bias current source of the OTA. Accordingly, the OTA is able to react quickly with an increased output current to a change of the output capacitance. After charging or discharging the load at the output of buffers BUF1 and/or BUF2, the buffers resume their quiescent state and no additional current is supplied by the bias current stages as the differential input signal returns to a value of zero volts.

Although the present invention has been described with reference to a specific embodiment, it is not limited to this embodiment and no doubt further alternatives will occur to the skilled person that lie within the scope of the invention as claimed.

What is claimed is:

1. A CMOS buffer circuit for liquid crystal display (LCD) drivers, comprising:
    an single stage operational transconductance amplifier (OTA) with a differential pair of transistors for receiving a differential input voltage, a bias current source coupled to the differential pair and a single-ended output,
    a first bias current generating stage with a differential pair of transistors coupled to receive the differential input voltage to produce an output current in an output current path in response to a positive differential input voltage,
    a second bias current generating stage with a differential pair of transistors coupled to receive the inverted differential input voltage to produce an output current in an output current path in response to a negative input voltage,
    wherein the output current paths of both bias current generating stages are combined in a common current path and the current in the common current path is mirrored to the bias current source of the single stage OTA, so as to increase the bias current through the bias current source in response to an increasing magnitude of the differential input voltage.

2. The CMOS buffer circuit according to claim 1, wherein the first and the second bias current generating stages are substantially similar to each other except that the first bias current generating stage is coupled to receive the first differential input voltage and the second bias current generating stage is coupled to receive the inverted input voltage.

3. The CMOS buffer circuit according to claim 1, wherein the current through the bias current source of the OTA increases exponentially in response to an increasing magnitude of the differential voltage input to the current mirror from the two bias circuits.

4. The CMOS buffer circuit according to claim 3, wherein in each bias current generating stage has two diode coupled load transistors coupled to the transistors of the differential pair and a constant current source coupled to the common source connection of the differential pair, the CMOS buffer comprising further a first and second transistor having their gates coupled to the gates of the respective load transistor and a common source connection coupled to the drain of a third transistor, the drain of the first transistor being coupled to ground and the drain of the second transistor being coupled to a constant current source, wherein the source of the third transistor is connected to a supply voltage and the gate of the third transistor is coupled to the drain of the second transistor, wherein a fourth transistor is coupled by its gate to the third transistor to mirror the current through the third transistors to the fourth transistor.

5. The CMOS buffer circuit according to claim 1, wherein the output of the OTA is connected to a negative input of the differential pair to operate as a voltage follower.

* * * * *